United States Patent [19]

Kamiyama et al.

[11] Patent Number: 5,322,764
[45] Date of Patent: Jun. 21, 1994

[54] METHOD FOR FORMING A PATTERNED RESIST

[75] Inventors: Kinya Kamiyama; Takeshi Fijino, both of Hyogo, Japan

[73] Assignee: Mitsubishi Denki Kabushiki Kaisha, Tokyo, Japan

[21] Appl. No.: 882,220

[22] Filed: May 13, 1992

[30] Foreign Application Priority Data

May 21, 1991 [JP] Japan .................................. 3-115826

[51] Int. Cl.$^5$ ................................................. G03C 5/00
[52] U.S. Cl. ..................... 430/324; 430/325; 430/326; 156/628; 156/643; 156/659.1
[58] Field of Search ............... 430/317, 313, 324, 325, 430/326; 156/628, 643, 659.1

[56] References Cited

U.S. PATENT DOCUMENTS 4,613,398  9/1986  Chiong .................................. 430/325
4,908,298  3/1990  Hefferon .............................. 430/325

FOREIGN PATENT DOCUMENTS 2-24661  1/1990  Japan .

OTHER PUBLICATIONS

Coopmans et al., "Desire: A New Route to Submicron Optical Lithography", *Solid State Technology*, Jun. 1987, pp. 93-99.
"Desire: A Novel Dry Developed Resist System", Proceeding of SPIE 631,34, Fedor Coopmans, et al., 1986.

*Primary Examiner*—Marion E. McCamish
*Assistant Examiner*—Kathleen Duda
*Attorney, Agent, or Firm*—Lowe, Price, LeBlanc & Becker

[57] ABSTRACT

After a resist layer is formed on a substrate, a predetermined region of resist layer is exposed. A silylated layer is formed in the exposed region of resist layer. After the silylation, a part but not all of the unexposed portion of the resist layer is etched to expose a nonsilylated side portion of the exposed region. The non-silylated side portion of the exposed region uncovered by etching is then silylated. The remainder of the unexposed region is removed, so that a resist pattern is finally obtained. According to the method, a fine resist pattern can be formed without side etch.

16 Claims, 9 Drawing Sheets

METHOD FOR FORMING A PATTERNED RESIST

CROSS REFERENCES TO RELATED APPLICATIONS

This application is related to co-pending application Ser. No. 07/657,785, filed Feb. 20, 1991, commonly assigned with the present invention.

BACKGROUND OF THE INVENTION

1. Field of the Invention

The present invention relates to a method for forming a patterned resist in manufacturing an integrated circuit, and, more particularly, to a method for forming a smaller patterned resist using silylation.

2. Description of the Background Art

An integrated circuit (IC) having a transistor, a resistor, a condenser or the like mounted on one chip has been recently used not only for information and communication appliances but also for many industrial appliances. The IC has helped every kind of industrial appliances to have a higher precision and intelligence. The IC has been developed to an LSI, a VLSI, and a ULSI as the integration density has been increased.

As to the IC, thousands of transistors were integrated on a several mm square chip around 1970. In these days, however, more than millions of transistors are integrated on a chip. Meanwhile, a width of an interconnection formed in an IC has been decreased from about 10 $\mu$m to not more than 1 $\mu$m.

Many advantages can be obtained by miniaturizing elements formed in an IC and increasing the integration density. As the size of an element becomes smaller, an IC can be more compact and lighter, and also the cost of manufacturing can be reduced. In addition, by uniting more elements, fewer connections made by soldering or the like are necessary, and therefore reliability of the IC improves.

Furthermore, if the length of an interconnection between elements is shorter because of an increased integration density, a time required for processing signals in an IC can be dramatically shortened, which results in reduction of power consumption. In case of a MOS integrated circuit, for example, under a scale down low, if dimension of an element is 1/k, a delay time is 1/k and power consumption is decreased to $1/k^2$ per element.

An increase of the number of elements in one chip for increasing an integration density of an IC depends on the technology of forming many fine structures on a wafer. In the technology, a process in which resist is applied onto a wafer and patterned to a desired shape is a key to the formation of very small structures. The process must be repeated ten and several times at most until a VLSI is finished.

For example, when a transistor is formed on a silicon substrate, a source portion and a drain portion are formed through the step shown in FIG. 1 using resist. Referring to FIG. 1, first, a silicon substrate 11 on which an oxide film 18 is formed is prepared (FIG. 1A). A photoresist film 12 is applied to oxide film 18 (FIG. 1B). A photomask 13 is provided above photoresist film 12 and ultraviolet rays 14 are directed to the photoresist film through photomask 13 (FIG. 1C). After developing and baking, a resist pattern 12' having a predetermined shape is obtained (FIG. 1D). Etching is then carried out, and only the portion of the oxide film which is not covered with resist pattern 12' is removed (FIG. 1E). After a resist pattern is removed by plasma ashing, impurities are diffused into an uncovered portion of a silicon substrate to form a source portion 19 and a drain portion 20 (FIG. 1F).

In order to form an interconnection on the substrate, for example, a step shown in FIG. 2 can be adapted. Referring to FIG. 2, first, an aluminum layer 30 is deposited on a substrate 21 (FIG. 2A). As shown in FIG. 2b, after a resist film 22 is formed on aluminum layer 30, ultraviolet rays 24 are directed to resist film 22 through photomask 23 (FIG. 2C). Development and baking are then carried out to obtain a resist pattern 22' (FIG. 2D). After only an uncovered aluminum layer is removed by etching and then a resist pattern is removed by plasma ashing, an interconnection layer 30' having a desired shape is obtained (FIG. 2E).

In the above described process, it is obvious that the size of elements to be formed and a width of an interconnection layer depend on the size of a resist pattern. In order to form a smaller element and a narrower interconnection layer, it is necessary to produce a finer patterned resist. Therefore, processing technology of a resist film is very important for increasing an integration density of an IC.

As one of the technologies for forming a finer resist pattern, there are methods of using silylation and dry development. One of the most well-known methods is a DESIRE system disclosed by Coopmans and Roland in 1986 (Proceeding of SPIE 631,34 (1986)). The basic steps of the system will be described with reference to FIG. 3.

As shown in FIG. 3A, first, a resist layer 32 is formed on a substrate 31. The resist layer can be formed of material available from UCB Electronics (Belgium) or Japan Synthetic Rubber Co., Ltd. under a product name of "PLASMASK". PLASMASK includes novolak resin and quinonediazide as main components. Novolak resin and quinonediazide are expressed by the following chemical formulas.

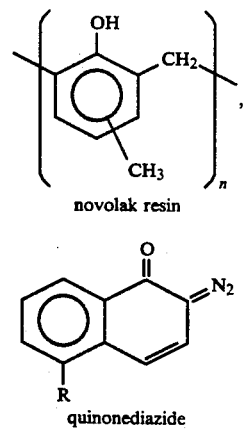

novolak resin quinonediazide

After the material is applied to the substrate, for example, by a spinner, prebaking is carried out at an appropriate temperature.

Then, ultraviolet rays 34 of wavelength 248 nm–436 nm are directed to resist layer 32 covered with a mask 33 as shown in FIG. 3B.

After exposure, the substrate is placed within a vacuum chamber, and heated at about 120°–200° C. While an exposed region of the resist layer 35 is stable against heating, a crosslinking reaction proceeds by heating in unexposed region 37.

Thereafter, a hexamethyldisilazane (HMDS) gas is introduced into the vacuum chamber at an appropriate temperature by using $N_2$ as a carrier gas and sprayed onto the substrate. HMDS is selectively received only by the exposed portion of the resist layer. In the exposed portion, for example, in blackened portion 36 shown in FIG. 3C, a silylating reaction occurs as shown by the following formula.

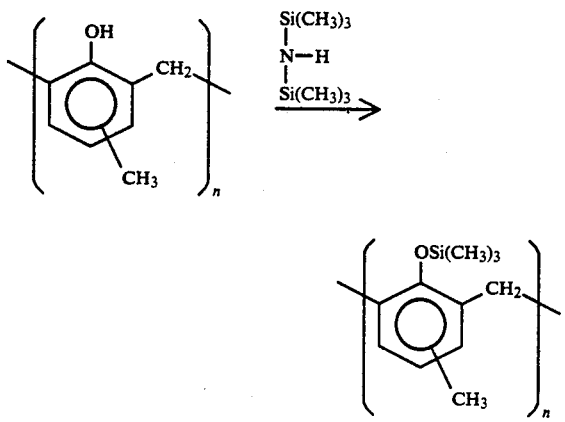

Following that, the resist layer is subjected to dry development using reactive ion etching (RIE). In RIE, $O_2$ plasma is used. In the dry development, a silicon compound $SiO_2$ is formed in the portion 36 where selective silylation has occurred (FIG. 3D). While the portions in which $SiO_2$ is formed are resistant to RIE, the other portion in which no HMDS is received is formed only of material volatilized by oxidation, so that it is etched by RIE. The dry development results in a patterned resist having only the exposed region of the resist layer left as finally shown in FIG. 3E.

The DESIRE system is applied in order to form a fine resist pattern. However, in the system, a resist pattern whose side portion is etched by RIE tends to be formed. That is, as shown in FIG. 4, a resist pattern 40 having narrow parts tends to be formed because of side etch or under cut. When a finer resist pattern is formed, such a resist pattern having narrow parts may lean or collapse.

A method in which the side-etch can be prevented in RIE with a multi-layer resist film system is disclosed in Japanese Patent Laying-Open No. 2-24661. The method will be described with reference to the figures.

Referring to FIG. 5A, a first resist layer 52 is formed on a semiconductor substrate 51. A second resist layer 53 including silicon is deposited on first resist layer 52 (FIG. 5B). After a third resist layer 54 is formed on second resist layer 53 (FIG. 5C), third resist layer 54 is exposed using a mask having a predetermined pattern (FIG. 5D). The third resist layer is developed, so that resist pattern 54' is obtained (FIG. 5E). Using resist pattern 54' as a mask, second resist layer 53 is anisotropically etched (FIG. 5F). Using resist pattern 53' formed of the second resist layer as a mask, the first resist layer is anisotropically etched. This anisotropic etching is temporarily interrupted after about a half of first resist layer 52 is etched. At this time, resist patter 54' of the third layer is removed (FIG. 5G). Thereafter, as shown in FIG. 5H, silicon is introduced onto the surface 55 of first resist layer newly formed by etching, so that a silylated layer 56 is formed. A horizontal portion of silylated layer 56 is anisotropically etched away (FIG. 5I). Thereafter, first resist layer 52 is anisotropically etched again until semiconductor substrate 51 is uncovered. As a result, as shown in FIG. 5J, patterned resist 52' is obtained.

In this method, by forming a silylated layer on a side portion of a first resist layer, the first resist layer is protected and formation of a resist layer having narrow parts is prevented, as in the DESIRE described above. However, in this method, when a first resist layer is patterned, two additional resist layers must be formed. This increases the number of steps for forming a patterned resist. As described above, since a process for forming a resist pattern is repeated many times in manufacturing an LSI, the time and cost required for manufacturing an LSI increase as the number of steps necessary for one process increases.

In addition, in the above described method, a layer much thinner than a first resist layer must be deposited on the first resist layer to be patterned. Such a thin layer is susceptible to dust. If the layer is affected by dust and a resist pattern having a desired shaped can not be obtained, a yield in manufacturing an LSI decreases.

Furthermore, as shown in FIGS. 5H through 5I, if direction of the etching is not controlled well in the step of removing a horizontal portion of a silylated layer by anisotropic etching, there is a possibility that a silylated layer formed on a side surface is also etched away. Therefore, in this method, a possibility of etch back as described above remains.

SUMMARY OF THE INVENTION

An object of the invention is to provide a method in which a fine resist pattern can be formed without side etch or undercut in fewer steps.

Another object of the present invention is to provide a method of good reproductiveness in which a fine resist pattern having a desired shape can be formed by preventing an influence of dust.

According to one aspect of the present invention, a method is provided which is applicable to formation of, particularly, a negative type resist pattern. In the method, after a resist layer is formed, a predetermined region on a resist layer is exposed. The exposed region of the resist layer is silylated. After a part but not all of an unexposed region of the resist layer is removed and a portion of the exposed region is uncovered, the uncovered portion of the exposed region is silylated. Finally, the remainder of the unexposed region is removed and a resist pattern is obtained.

A resist layer ca be preferably formed of material including novolak resin and quinonediazide as main components. The resist material can be applied to a substrate by several kinds of tools such as a spinner. Prebaking of the resist layer is performed at an appropriate temperature for an appropriate time depending on the thickness of the layer.

Photolithography is generally applied to the method adapted to expose a region of a resist layer. In photolithography, exposure by ultraviolet rays through a mask can be carried out using a general exposure device. A wavelength of the ultraviolet rays can be in a range of, for example, 248 to 436 nm.

After exposure, the exposed region of the resist layer is silylated. Silylation can be done by exposing the resist layer to, for example, hexamethyldisilazane (HMDS), tetramethyldisilazane (TMDS) or 1, 2-dichlorotetramethylsiloxane. These reagents are preferably supplied to a resist layer by a carrier gas (such as $N_2$). For example, if HMDS is used, a gas obtained by blowing a $N_2$ gas into an HMDS solution may be supplied to the resist layer.

Silylation can be carried out, for example, at a temperature of 160° C. for 3 through 6 minutes. If the resist layer is formed of material including novolak resin and quinonediazide, the silylating reagent is received only by an exposed portion of the resist layer, and an organic silicon compound shown by the above chemical formula is formed through reaction with novolak resin. Such selective silylation is based on the fact that quinonediazide in the resist layer changes to carboxylic acid through exposure. Thus, a silylated layer is formed in the exposed portion.

In case of a negative type, an unexposed region of the resist layer can be preferably removed by reactive ion etching (RIE). An exposed region is protected by a silylated layer, so that it is not etched away by RIE. For RIE, for example, $O_2$ plasma can be used.

The time to interrupt etching in first removal of an unexposed region may be, for example when about $\frac{1}{3}-\frac{1}{2}$ of the thickness of the resist layer is removed; however, it is not limited thereto. The time depends on the thickness of the resist layer. In the step, only a part of the exposed region is uncovered.

The uncovered portion of the exposed region is further silylated. Silylation can be carried out as described above. Silylating material is received selectively by the exposed region, so that a silylated layer is formed in the uncovered portion.

Finally, the remainder of the unexposed region is removed, and a resist pattern having a desired shape can be obtained. In the removing step, RIE can be preferably used. For the etching gas, for example, $O_2$ plasma is used.

In the final removing step, the silylated layer formed in the uncovered portion of the exposed region serves to suppress side etch. The uncovered portion is entirely protected by the silylated layer, so that it is not corrected by RIE. In addition, since etching of the unexposed portion proceeds by using the portion protected by the silylated layer as a mask, another uncovered portion by the etching has a desired shape.

According to another aspect of the invention, a method for controlling, in particular, patterning precisely is provided. In this aspect, the steps of removing a part but not all of an unexposed region and silylating an uncovered portion are repeated at least twice. The number of times the steps can be determined as required. For example, the number can be increased as the thickness of the resist layer is increased.

The method according to this aspect is characterized in that the number of steps of removing a part of a resist layer and silylating is increased, so that protection against etching is enhanced. This method is particularly effective when a thick resist pattern is desired. The same manner as in the previous aspect can be applied to the formation of a resist layer, silylation and removing of the resist layer in the method.

According to still another aspect of the present invention, a method suitable for formation of, in particular, a positive type resist pattern is provided. In this method, after a resist layer is formed, a predetermined region on the resist layer is exposed. An unexposed region of the resist layer is then silylated. After a part but not all of the exposed region of the resist layer is removed and a portion of the unexposed region is uncovered, the uncovered portion of the unexposed region is silylated. Finally, the remainder of the exposed portion is removed and the finished resist pattern is obtained.

In this aspect, the resist layer can be preferably formed of material including novolak resin, an acid generating agent and a crosslinking agent as main components. The resist material can be applied to the substrate by several kinds of tools such as a spinner. Prebaking in forming a resist layer can be performed at an appropriate temperature for an appropriate time depending on the thickness of the layer.

In this method, electron beam lithography can be applied in order to expose a region of a resist layer. If material substantially formed of novolak resin, an acid generating agent and a crosslinking agent is used, acid is generated from the acid generating agent in a region to which electronic beams are directed. A crosslinking reaction of base resin with the crosslinking agent occurs, with generated acid serving as a catalyst, in baking after exposure. A crosslinked portion receives little silylating agent supplied in the next step. Thus, since little silylating agent is diffused in the exposed region, only the unexposed region is selectively silylated.

Silylation can be carried out using, for example, hexamethyldisilazane (HMDS), tetramethyldisilazane (TMDS), or 1, 2-dichlorotetramethylsiloxane. These reagents are preferably supplied to a resist layer using a carrier gas (for example, $N_2$).

If the resist material includes novolak resin, the silylating reagent is received only by the unexposed portion of the resist layer, and an organic silicon compound as shown by the above chemical formula is formed through reaction with novolak resin. A silylated layer is thus formed in the unexposed portion.

In case of a positive type, an exposed region of a resist layer can be etched away by RIE. An unexposed region is protected by a silylated layer, so that it is not etched away by RIE. In RIE, for example, $O_2$ plasma can be applied. Only a part of the unexposed region is uncovered in the step.

The uncovered portion of the unexposed region is further silylated. Silylation can be carried out as in the above method. Silylating agent is selectively received by the unexposed region, and the silylated layer is formed in a surface of the uncovered portion.

Finally, the remainder of the exposed region is removed, so that a resist pattern having a desired shape can be obtained. RIE can be preferably used in the removing step. For an etching gas, for example, $O_2$ plasma is applied. In the final removing step, a silylated layer formed on the uncovered portion of the unexposed region serves to suppress side etch. Since etching of the exposed portion proceeds using a portion protected by the silylated layer as a mask, the uncovered portion by the etching has a desired shape.

According to yet another aspect of the present invention, a method for controlling, in particular, patterning precisely is provided. In this aspect, the steps of removing a part but not all of an exposed region of the resist layer and silylating an uncovered portion are repeated at least twice. The number times of the steps are repeated can be determined as required. For example, the number can be increased as the thickness of the resist layer is increased.

This method is characterized in that the number of the steps of removing a part of the resist layer and silylating is increased, so that protection against etching is enhanced. This method is particularly effective when a thick resist pattern is desired. In addition, the same manner as that for a positive type can be applied to formation of the resist layer, silylation and removing of the resist layer.

As described above, after etching is interrupted, silylation is carried out, so that a side surface of an uncovered portion is silylated. The silylated side surface is not eroded by etching. Thus, etching is carried out with an unexposed side surface protected until the final resist pattern is obtained, so that side etch or undercut is prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A first embodiment of the present invention will be hereinafter described with reference to the figures.

Figure 1A:
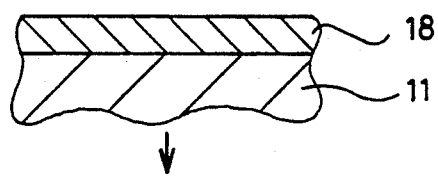
FIGS. 1A-1F are schematic diagrams showing steps of forming a source portion and a drain portion of a transistor using a resist pattern.
Figure 1B:
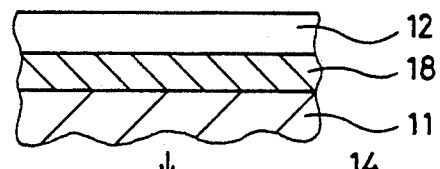
Figure 1C:
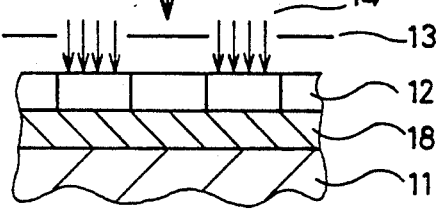
Figure 1D:
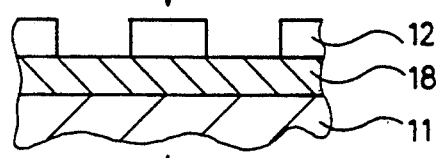
Figure 1E:
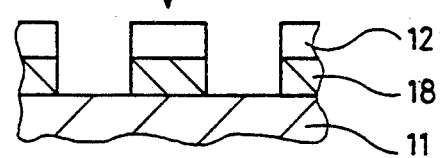
Figure 1F:
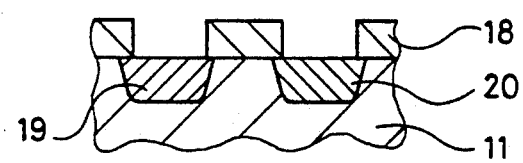
Figure 2A:
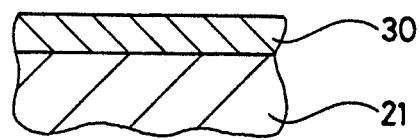
FIGS. 2A-2E are schematic diagrams showing steps of forming an interconnection layer on a substrate using a resist pattern.
Figure 2B:
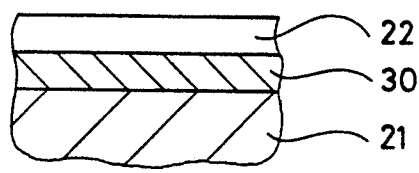
Figure 2C:
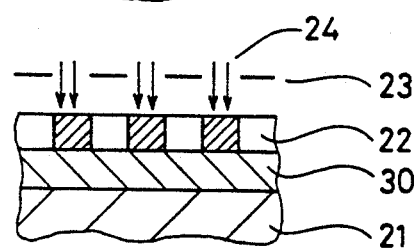
Figure 2D:
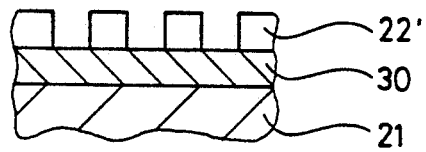
Figure 2E:
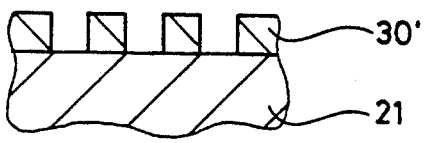
Figure 3A:
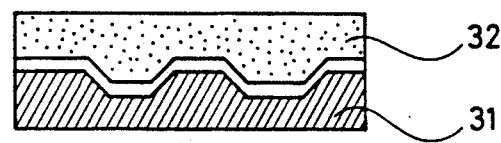
FIGS. 3A-3E are schematic diagrams showing respective steps of a conventional DESIRE method.
Figure 3B:
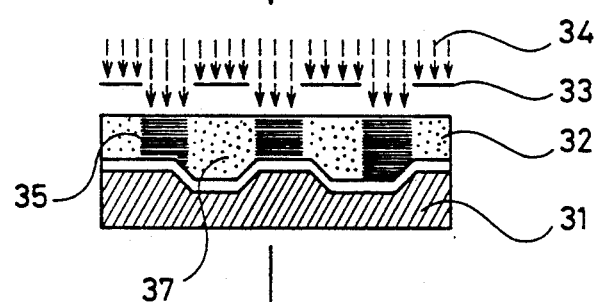
Figure 3C:
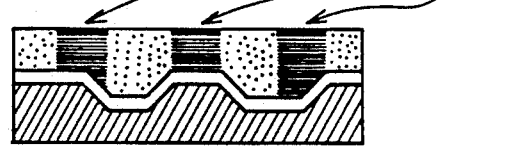
Figure 3D:
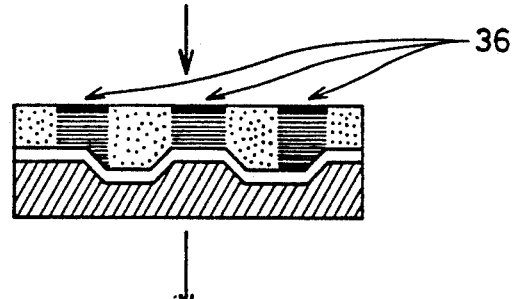
Figure 3E:
Figure 4:
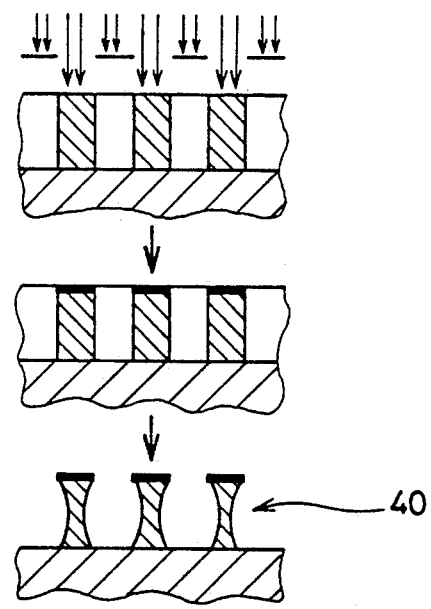
FIG. 4 is a schematic diagram showing a condition when side etch occurs in the DESIRE method.
Figure 5A:
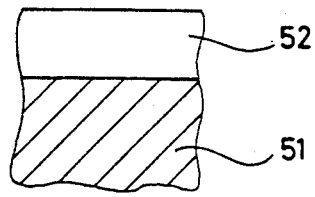
FIGS. 5A-5J are schematic diagrams in use for explaining each steps are repeated of the improved conventional method for preventing side etch.
Figure 5B:
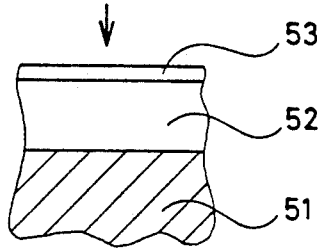
Figure 5C:
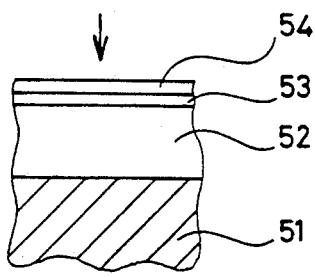
Figure 5D:
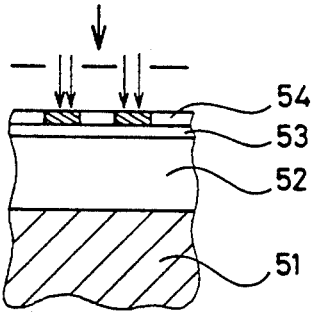
Figure 5E:
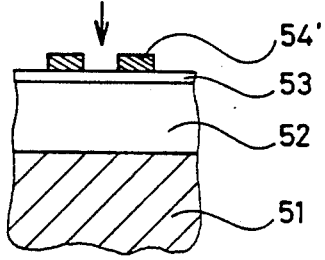
Figure 5F:
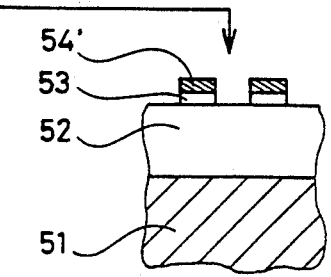
Figure 5G:
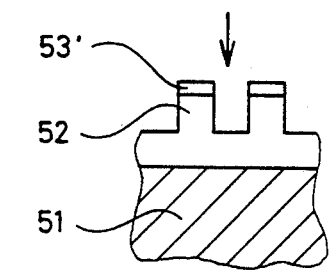
Figure 5H:
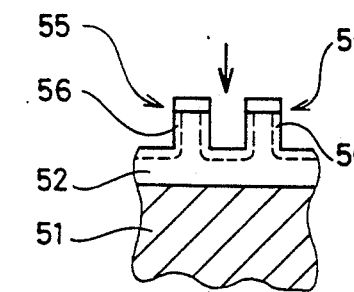
Figure 5I:
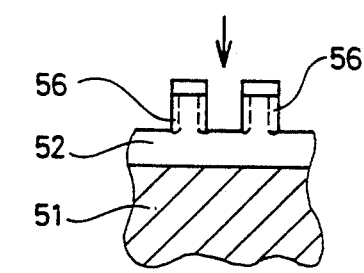
Figure 5J:
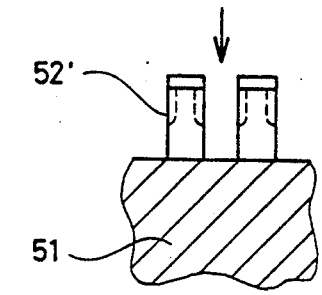
Figure 6A:
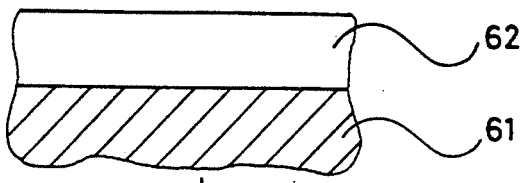
FIGS. 6A-6F are schematic diagrams showing conditions of a resist layer formed in respective steps in a first embodiment according to the present invention.

Referring to FIG. 6A, a resist layer 62 is formed on a semiconductor substrate 61. For forming the resist layer, material available from UCB electronics (Belgium) or Japan Synthetic Rubber Co., Ltd. under a product name of "PLASMASK" is used. A detailed composition of PLASMASK is not clear; however, PLASMASK includes novolak resin and quinonediazide as main components. The material is applied to semiconductor substrate 61 using a spinner. Prebaking after application is carried out at 120° C. for 90 seconds. The obtained thickness of resist layer 62 is 1.2-1.5 μm.

Figure 6B:
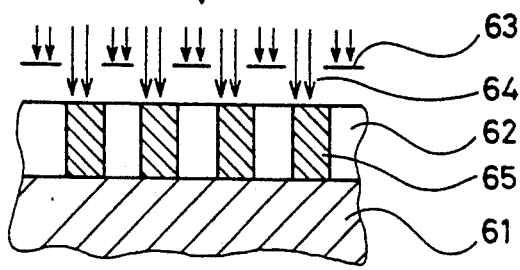

Photomask 63 is provided on resist layer 62 and ultraviolet rays 64 are directed thereto (FIG. 6B). As ultraviolet rays, g lines of about 500 mW or i lines of about 200 mW are used. A predetermined pattern according to the photomask is printed on the resist layer through exposure. An exposed region 65 is hatched in FIG. 6B.

Figure 7:
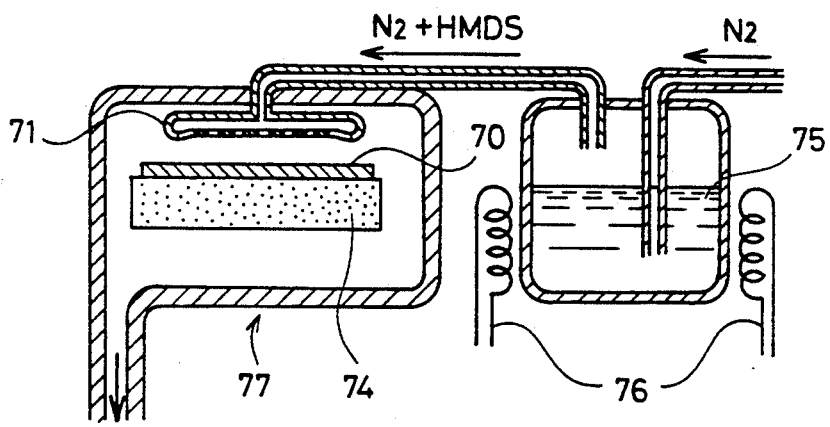
FIG. 7 is a schematic diagram showing one specific example of a device used for silylating a resist layer according to the present invention.

Thereafter, the substrate is moved into the device shown in FIG. 7 in order to perform silylation. Referring to FIG. 7, substrate 70 on which the resist layer is formed is placed on a heating plate 74 provided in a vacuum chamber 77. Vacuum chamber 77 is evacuated. A gas nozzle 71 is provided above substrate 70. Gas obtained by blowing $N_2$ gas into a solution 75 of a silylating agent heated by a eater 76 is sprayed onto substrate 70 through gas nozzle 71. HMDS is used as the silylating agent.

Figure 6C:
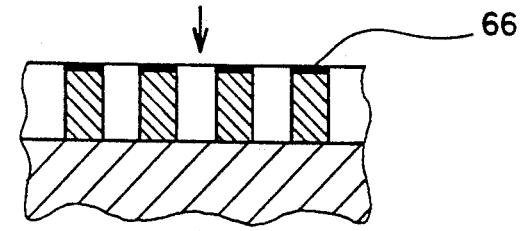

One specific example of silylation will be given below. First, substrate 70 is held at 160° C. by heating plate 74 for 3 minutes in evacuated vacuum chamber 7. Then, $N_2$ is blown into silylating agent 75 held at 50° C. by heater 76, and the silylating agent is introduced into vacuum chamber 77 through nozzle 71. The substrate is then exposed to HMDS vapor at 160° C. for 4 minutes. Consequently, the surface of the exposed region is silylated as shown in FIG. 6C. The silylated portion 66 is blackened in the figure.

Figure 6D:
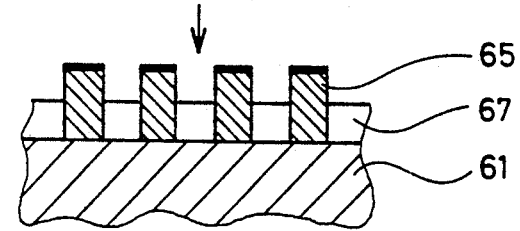

The substrate is next moved to a device for a dry development. A parallel-flat type reactive ion etching device is applied as a device for dry development. The dry development is performed using RIE. Oxygen is supplied at a flow rate of 70 sccm for etching. The pressure of this gas is adjusted to 4 m Torr. A voltage applied to a band magnetron etcher for RIE is 79 V. Dry development is interrupted after being performed for about one minute. After etching, an undeveloped portion 67 remains on substrate 61, and the exposed region 65 is uncovered as shown in FIG. 6D.

Figure 6E:
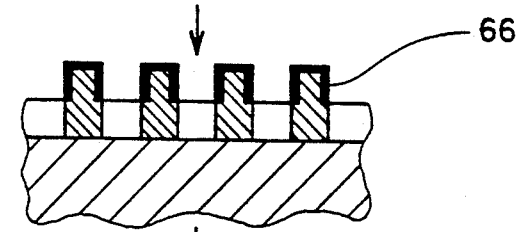

After the dry development is interrupted, the substrate is accommodated in the silylating device again. Silylation is performed in the same procedure and under the same conditions as in the foregoing silylating step. A side portion 66' of the region uncovered through development is newly silylated as a consequent, as shown in FIG. 6E. The newly silylated portion 66' is blacken in the figure.

Figure 6F:
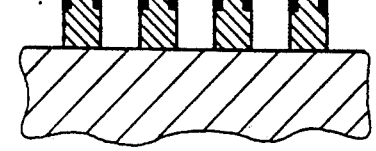

After silylation, the substrate is again moved to the RIE device and etched using $O_2$ plasma. The conditions for etching (a flow rate, pressure and voltage) are the same as in the aforementioned etching step. Etching continues until the semiconductor substrate is exposed. About 2 minutes of etching provides a final patterned resist (FIG. 6F).

A silylated layer is formed on a side surface of the uncovered portion in the final development step, so that the side surface is prevented from being corrected by the RIE. Thus, a patterned resist having narrow parts which is a problem in the conventional DESIRE system is not formed. A patterned resist obtained by this method has a fine shape without side corrosion, as shown in the figure.

In addition, about 10 steps of forming a resist pattern are necessary in a conventional technology using a multi-layer system, while only about 6 steps are necessary for the above-stated specific example according to the present invention. Thus, according to the present invention, a resist pattern can be formed without side etch or undercut in fewer steps. Furthermore, a step of removing an unnecessary portion of the silylated layer which is performed in the conventional technology is not required in the above embodiment. Therefore, according to the present invention, side etch possible in the conventional method is also avoided. According to the present invention, a fine resist pattern having a desired shape can be formed with a good reproductiveness in comparison with the conventional case.

A second embodiment according to the present invention will be hereinafter described with reference to the figures.

Figure 8A:
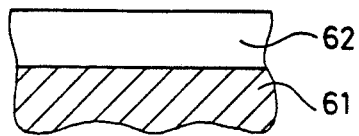
FIGS. 8A-8H are schematic diagrams showing conditions of a resist layer formed in respective steps in a second embodiment according to the present invention.
Figure 8B:
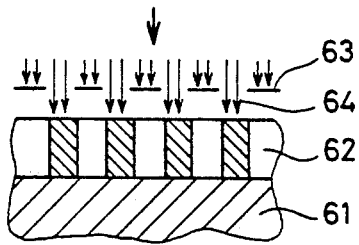
Figure 8C:
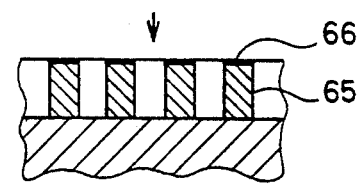
Figure 8D:
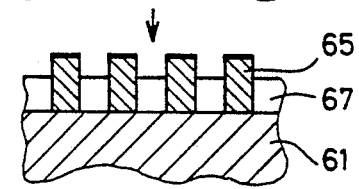
Figure 8E:
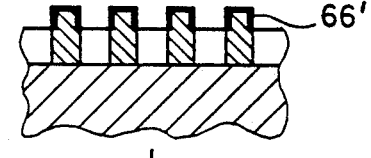
Figure 8F:
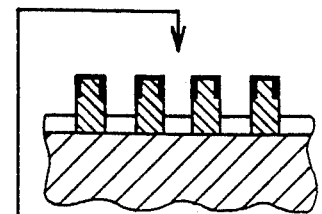

Referring to FIGS. 8A through 8E, after a resist layer 62 is formed on a semiconductor substrate 61, a side surface of an uncovered portion is silylated through development in the same steps as in the first embodiment. After silylation, the substrate is again moved to the RIE device and etched using $O_2$ plasma. The conditions for etching (a flow rate, pressure and voltage) are the same as in the first embodiment. However, etching is interrupted before the semiconductor substrate is uncovered (FIG. 8F).

Figure 8G:
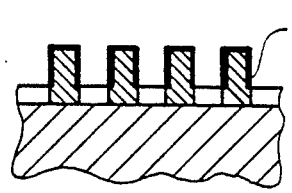
Figure 8H:
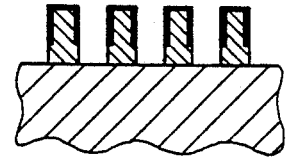

After etching is interrupted, the substrate is again accommodated into the silylated device. Silylation is performed in the same procedure and under the same conditions as in the foregoing silylating step. As a result, as shown in FIG. 8G, a silylated layer 86 is further formed in an side surface of an uncovered portion. Accordingly, the silylating step is repeated three times in the second embodiment. After silylation, the substrate is again moved to the RIE device and etched using $O_2$ plasma. Etching continues until the semiconductor substrate is uncovered. A final resist pattern is thus obtained (FIG. 8H).

Although the etching-silylating steps are repeated twice in the second embodiment, the steps can be repeated more times. The number of times of repetition can be arbitrarily determined depending on the conditions such as the thickness of the resist layer.

A third embodiment according to the present invention will be hereinafter described with reference to the figures. The third embodiment is one specific example for forming a resist pattern of a positive type.

Figure 9A:
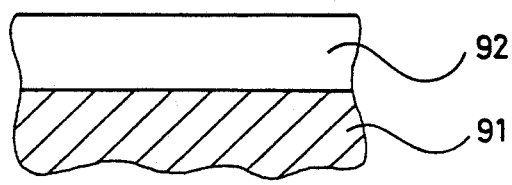
FIGS. 9A-9F are schematic diagrams showing conditions of a resist layer formed in respective steps in a third embodiment according to the present invention.
Figure 9B:
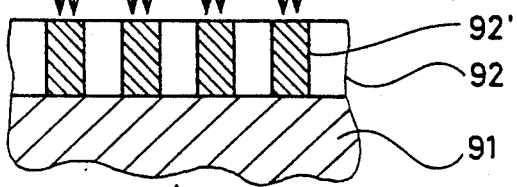

Referring to FIG. 9A, resist layer 92 is formed on semiconductor substrate 91. For forming the resist layer, material available from Shipley Company Inc. under a product name of "SAL601-ER7" is used. The material includes novolak resin, an acid generating agent and a crosslinking agent as main components. As shown in FIG. 9B, resist layer 92 is subjected to electron beam lithography. Acid is generated from an acid generating agent in a region 92' to which electron beams are directed. In region 92', a crosslinking reaction of base resin with crosslinking material occurs with the generated acid as a catalyst through baking after exposure.

Figure 9C:
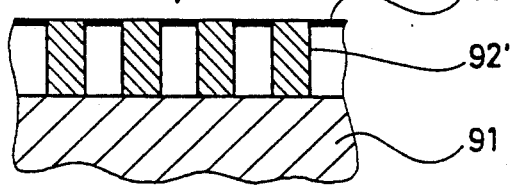

As in the first embodiment, silylation is performed. A crosslinked portion by the irradiation of the electron beams receives little silylating material, so that only an unexposed region is selectively silylated as shown in FIG. 9C. The silylated portion 96 is blackened in the figure.

Figure 9D:
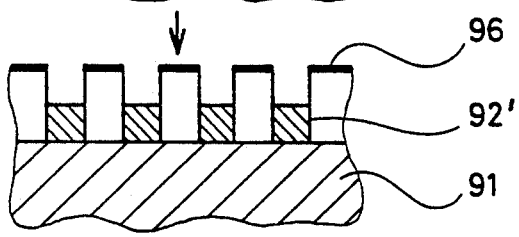

The substrate is then moved to a device for dry development. Dry development is carried out using RIE as in the first embodiment. Dry development is stopped when about half of the exposed region is removed. As a result, as shown in FIG. 9D, a portion of the unexposed region is uncovered.

Figure 9E:
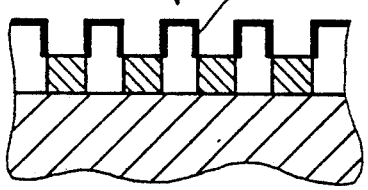
Figure 9F:
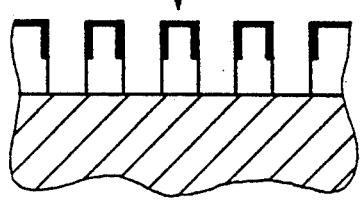

After RIE is interrupted, the substrate is again accommodated into the silylated device. Silylation is performed in the same procedure and under the same condition as in the first embodiment. A silylated layer 96' is newly formed in the side surface of the uncovered portion by etching (FIG. 9E). The substrate is again moved to the RIE device and etched using $O_2$ plasma. Etching continues until the semiconductor substrate is uncovered. As a result, as shown in FIG. 9F, the exposed portion is removed, and a resist pattern having a desired shape is formed. Side etch is also prevented by the silylated layer in the third embodiment. Therefore, a fine resist pattern can be formed using resist of a positive type with good reproductiveness as in the case of resist of a negative type.

In addition, although the etching-silylating steps are carried out only once in the third embodiment, the steps can be repeated plural times. That is, as in the second embodiment, after the silylating step, development is interrupted again and silylation can be performed again. The number of times of repetition can be arbitrarily determined depending on the conditions such as the thickness of the resist layer.

As described above, the present invention provides a method for forming a fine resist pattern without side etch in a single layer system in which a single resist layer is formed. The present invention does not require the steps of stacking a plurality of resist layers and removing an unnecessary portion of a silylated layer which are necessary for a conventional multi-layer system. As a result, not only a fine resist pattern can be formed in fewer steps compared to the conventional case, but also side etch possible in the conventional method is avoided. And hence, the present invention can be applied for forming a resist pattern particularly having line and space widths less than 1.0 μm.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for forming a patterned resist, comprising the steps of:
   forming a resist layer;
   exposing a region on said resist layer;
   silylating the exposed region of said resist layer;
   removing a part but not all of an unexposed region of said resist layer to uncover a nonsilylated side portion of said exposed region of said resist layer, with a portion of the unexposed region remaining on the substrate;
   silylating the uncovered side portion of said exposed region; and
   removing the remainder of the unexposed region to obtain a patterned resist.

2. The method for forming a patterned resist according to claim 1, wherein said resist layer is formed of material including novolak resin and quinonediazide.

3. The method for forming a patterned resist according to claim 1, wherein each of said silylating steps is carried out using a reagent selected from the group consisting of hexamethyldisilazane, tetramethyldisilazane and 1,2-dichlorotetramethylsiloxane.

4. The method for forming a patterned resist according to claim 1, wherein each of said removing steps is carried out using reactive ion etching.

5. The method for forming a patterned resist according to claim 1, wherein the steps of removing a part but not all of the unexposed region and silylating the uncovered nonsilylated side portion of the exposed region are repeated at least twice.

6. The method for forming a patterned resist according to claim 5, wherein said resist layer is formed of material including novolak resin and quinonediazide.

7. The method for forming a patterned resist according to claim 5, wherein each of said silylating steps is carried out using a reagent selected from the group consisting of hexamethyldisilazane, tetramethyldisilazane and 1,2-dichlorotetramethylsiloxane.

8. The method for forming a patterned resist according to claim 5, wherein each of said removing steps is carried out using reactive ion etching.

9. A method for forming a patterned resist, comprising the steps of:
   forming a resist layer;
   exposing a region on said resist layer;
   silylating an unexposed region of said resist layer;
   removing a part but not all of the exposed region of said resist layer to uncover a nonsilylated side portion of the unexposed region of said resist layer, with a portion of the exposed region remaining on the substrate;
   silylating the uncovered side portion of said unexposed region; and
   removing the remainder of said exposed region to obtain a patterned resist.

10. The method for forming a patterned resist according to claim 9 wherein, said resist layer is formed of material including novolak resin, an acid generating agent and a crosslinking agent.

11. The method for forming a patterned resist according to claim 9, wherein each of said silylating steps is carried out using a reagent selected from the group consisting of hexamethyldisilazane, tetramethyldisilazane and 1,2-dichlorotetramethylsiloxane.

12. The method for forming a patterned resist according to claim 9, wherein each of said removing steps is carried out using reactive ion etching.

13. The method for forming a patterned resist according to claim 9, wherein the steps of removing a part but not all of the exposed region and silylating the uncovered nonsilylated side portion of the unexposed region are repeated at least twice.

14. The method for forming a patterned resist according to claim 13, wherein said resist layer is formed of material including novolak resin, an acid generating agent and a crosslinking agent.

15. The method for forming a patterned resist according to claim 13, wherein each of said silylating steps is carried out using a reagent selected from the group consisting of hexamethyldisilazane, tetramethyldisilazane and 1,2-dichlorotetramethylsiloxane.

16. The method for forming a patterned resist according to claim 13, wherein each of said removing steps is carried out using reactive ion etching.

* * * * *